United States Patent
Ju et al.

(10) Patent No.: US 9,263,908 B2
(45) Date of Patent: Feb. 16, 2016

(54) BATTERY PACK HAVING LINEAR VOLTAGE PROFILE, AND SOC ALGORITHM APPLYING TO THE BATTERY PACK

(71) Applicant: SAMSUNG SDI CO., LTD., Yongin-si, Gyeonggi-do (KR)

(72) Inventors: Ri-A Ju, Yongin-si (KR); Hyun Kim, Yongin-si (KR); Suk-Kyum Kim, Yongin-si (KR); Seung-Min Kim, Yongin-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 349 days.

(21) Appl. No.: 13/803,818

(22) Filed: Mar. 14, 2013

(65) Prior Publication Data

US 2013/0341923 A1    Dec. 26, 2013

Related U.S. Application Data

(60) Provisional application No. 61/664,277, filed on Jun. 26, 2012.

(51) Int. Cl.
*H02J 7/14* (2006.01)
*H02J 7/00* (2006.01)
(Continued)

(52) U.S. Cl.
CPC .............. *H02J 7/007* (2013.01); *B60L 11/1861* (2013.01); *G01R 31/362* (2013.01); *H01M 4/587* (2013.01); *H01M 10/42* (2013.01); *H01M 10/0525* (2013.01); *H01M 10/44* (2013.01); *H01M 2010/4271* (2013.01); *H01M 2220/20* (2013.01);
(Continued)

(58) Field of Classification Search
USPC ......... 320/112, 132, 136, 139, 106, 134, 137, 320/162, 107, 141, 166, 125, 128, 130, 145, 320/155, 160; 324/427, 426, 430, 431, 433
See application file for complete search history.

(56) References Cited

U.S. PATENT DOCUMENTS 6,163,133 A    12/2000  Laig-Horstebrock et al.
6,300,763 B1 *  10/2001  Kwok ........................... 324/427
(Continued)

FOREIGN PATENT DOCUMENTS

EP    002660616    *  6/2013    ................... 320/112
FR    2-949-864 A1    3/2011
(Continued)

OTHER PUBLICATIONS

Hao Sun, et al.; "Hard carbon/lithium composite anode materials for Li-ion batteries"; Science Direct; Electrochimica Acta 52 (2007), pp. 4312-4316.

(Continued)

*Primary Examiner* — Edward Tso
*Assistant Examiner* — Alexis A Boateng
(74) *Attorney, Agent, or Firm* — Lee & Morse, P.C.

(57) ABSTRACT

A battery pack includes a rechargeable battery module and a battery management system for controlling charging and/or discharging of the battery module. The battery module may include a substantially linear charging and discharging voltage-time profile within at least part of the charging and discharging cycle of the battery module, and the battery management system may be configured to calculate a state of charge of the battery module by using linear charging and/or discharging characteristics of the battery module.

13 Claims, 8 Drawing Sheets

(51) Int. Cl.
  *B60L 11/18* (2006.01)
  *G01R 31/36* (2006.01)
  *H01M 4/587* (2010.01)
  *H01M 10/42* (2006.01)
  *H01M 10/0525* (2010.01)
  *H01M 10/44* (2006.01)

(52) U.S. Cl.
  CPC .......... *Y02T 10/7005* (2013.01); *Y02T 10/7011* (2013.01); *Y02T 10/7044* (2013.01); *Y02T 10/7055* (2013.01)

(56) References Cited

U.S. PATENT DOCUMENTS

| | | | |
|---|---|---|---|
| 6,891,355 | B2 | 5/2005 | Kernahan |
| 8,190,384 | B2* | 5/2012 | Zhang et al. ................ 702/63 |
| 8,624,560 | B2* | 1/2014 | Ungar et al. ................ 320/164 |
| 2005/0134230 | A1* | 6/2005 | Sato et al. ................... 320/136 |
| 2005/0248315 | A1* | 11/2005 | Hartley et al. .............. 320/132 |
| 2007/0111044 | A1* | 5/2007 | Chang .......................... 429/9 |
| 2009/0039831 | A1* | 2/2009 | Ichikawa ..................... 320/118 |
| 2009/0048793 | A1* | 2/2009 | Schoch ......................... 702/63 |
| 2010/0052617 | A1* | 3/2010 | Aridome et al. ............. 320/132 |
| 2010/0085063 | A1* | 4/2010 | Lebrunie et al. ............ 324/537 |
| 2010/0256936 | A1* | 10/2010 | Darilek et al. ................ 702/63 |
| 2011/0234167 | A1* | 9/2011 | Kao et al. ..................... 320/132 |
| 2011/0298417 | A1* | 12/2011 | Stewart et al. ............... 320/107 |
| 2012/0001591 | A1* | 1/2012 | Fukaya ......................... 320/108 |
| 2012/0043929 | A1* | 2/2012 | Yazami ......................... 320/107 |
| 2012/0098481 | A1* | 4/2012 | Hunter et al. ................ 320/106 |
| 2012/0200266 | A1* | 8/2012 | Berkowitz et al. .......... 320/139 |
| 2012/0274281 | A1* | 11/2012 | Kim .............................. 320/112 |

FOREIGN PATENT DOCUMENTS

| | | |
|---|---|---|
| JP | 2005-151643 A | 6/2005 |
| JP | 2009-129769 A | 6/2009 |
| JP | 2010-206018 A | 9/2010 |
| KR | 10 2005-0061606 A | 6/2005 |
| KR | 10 2007-0020841 A | 2/2007 |
| KR | 10 2011-0033995 A | 4/2011 |
| WO | WO-2011-030024 A1 | 3/2011 |

OTHER PUBLICATIONS

Mary L. Patterson, Ph.D.; "Anode Materials for Lithium Ion Batteries"; Enerdel; Indiana University Battery Workshop, Nov. 13, 2009.

* cited by examiner (a)

| SOC | 0.2C | | | 1C | | |
|---|---|---|---|---|---|---|
| | time(min) | #1 voltage(v) | #2 voltage(v) | time(min) | #1 voltage(v) | #2 voltage(v) |
| 100 | 300 | 4.196 | 4.196 | 60 | 4.189 | 4.19 |
| 95 | 285 | 4.13 | 4.129 | 57 | 4.121 | 4.121 |
| 90 | 270 | 4.065 | 4.065 | 54 | 4.056 | 4.056 |
| 85 | 255 | 3.999 | 3.999 | 51 | 3.990 | 3.991 |
| 80 | 240 | 3.933 | 3.933 | 48 | 3.926 | 3.925 |
| 75 | 225 | 3.867 | 3.867 | 45 | 3.859 | 3.859 |
| 70 | 210 | 3.801 | 3.801 | 42 | 3.793 | 3.793 |
| 65 | 195 | 3.734 | 3.735 | 39 | 3.726 | 3.726 |
| 60 | 180 | 3.665 | 3.666 | 36 | 3.657 | 3.657 |
| 55 | 165 | 3.594 | 3.595 | 33 | 3.586 | 3.585 |
| 50 | 150 | 3.521 | 3.521 | 30 | 3.511 | 3.51 |
| 45 | 135 | 3.444 | 3.445 | 27 | 3.433 | 3.432 |
| 40 | 120 | 3.364 | 3.365 | 24 | 3.351 | 3.351 |
| 35 | 105 | 3.281 | 3.282 | 21 | 3.266 | 3.265 |
| 30 | 90 | 3.195 | 3.197 | 18 | 3.178 | 3.177 |
| 25 | 75 | 3.11 | 3.111 | 15 | 3.09 | 3.089 |
| 20 | 60 | 3.025 | 3.027 | 12 | 3.002 | 3.002 |
| 15 | 45 | 2.938 | 2.94 | 9 | 2.91 | 2.909 |
| 10 | 30 | 2.839 | 2.842 | 6 | 2.797 | 2.797 |
| 5 | 15 | 2.702 | 2.707 | 3 | 2.286 | 2.278 |
| 0 | 0 | 2 | 2 | 0 | 2 | 2 |

BATTERY PACK HAVING LINEAR VOLTAGE PROFILE, AND SOC ALGORITHM APPLYING TO THE BATTERY PACK

CROSS-REFERENCE TO RELATED APPLICATION

The present application claims priority under 35 U.S.C. §119(e) to U.S. Provisional Application No. 61/664,277, filed on Jun. 26, 2012, and entitled: "BATTERY PACK HAVING LINEAR VOLTAGE PROFILE, AND SOC ALGORITHM APPLYING TO THE BATTERY PACK," which is incorporated herein by reference in its entirety.

BACKGROUND

1. Field

Embodiments relate to a battery pack and a state of charge (SOC) algorithm applied to the battery pack.

2. Description of the Related Art

In general, a secondary battery is a battery that is rechargeable and dischargeable, unlike a primary battery that may not be recharged. The secondary battery may be used as a single battery or may be used as a battery module that includes a plurality of batteries as a unit, according to a kind of an external device to which the battery is applied.

SUMMARY

Embodiments are directed to a battery pack, including a rechargeable battery module and a battery management system for controlling charging and/or discharging of the battery module. The battery module may include a substantially linear charging and discharging voltage-time profile within at least part of the charging and discharging cycle of the battery module, and the battery management system may be configured to calculate a state of charge of the battery module by using linear charging and/or discharging characteristics of the battery module.

The battery management system may be arranged to calculate a second state of charge of the battery module after a time period of charging or discharging by determining a first state of charge of the battery module and then using the linear charging and/or discharging characteristics of the battery module.

The first state of charge may be a current state of charge of the battery module and the second state of charge may be a predicted state of charge of the battery module, or the first state of charge may be a previous state of charge of the battery module and the second state of charge may be a current state of charge of the battery module.

The battery management system may be configured to determine the first state of charge of the battery module by measuring an output voltage of the battery module.

The battery management system may be configured to determine the substantially linear charging and discharging voltage-time profile.

The battery management system may be configured to determine a charging and discharging voltage-time profile over a sub-range of state of charges, and then use the same to determine the substantially linear voltage-time profile for a wider range of state of charges.

The battery management system may be configured to use the determined substantially linear charging and discharging voltage-time profile to determine a substantially linear charging and discharging voltage-state of charge profile.

A charging and discharging voltage-state of charge profile of the battery module may be linear within a range of states of charge from 70% to 90% state of charge.

The battery module may consist of one or more lithium ion batteries.

The one or more lithium ion batteries may each include a negative active material, the negative active material including carbon black and soft carbon.

The negative active material may include a total weight amount of the carbon black and the soft carbon that is made up of about 54.5 to 99.5% of the soft carbon and about 0.5 to 45.5% of the carbon black.

The negative active material may include about 54.5 to 99.5% of the soft carbon and about 0.5 to 45.5% of the carbon black.

Embodiments are also directed to a power apparatus for an idle stop and go system for starting an engine, including a battery pack according to an embodiment, a power generating module for charging the battery pack, and a starter motor arranged to be powered by discharge of the battery pack.

On starting the engine, the battery management system may be configured to determine the substantially linear charging and discharging voltage-time profile and may be arranged to use the determined substantially linear charging and discharging voltage-time profile to determine a substantially linear charging and discharging voltage-state of charge profile. And the battery management system is arranged to determine an engine start voltage value of the battery module based on an elapsed time using the determined substantially linear charging and discharging voltage-time profile, and then using the engine start voltage value and the determined substantially linear charging and discharging voltage-state of charge profile to determine an engine start state of charge value.

BRIEF DESCRIPTION OF THE DRAWINGS

Features will become apparent to those of skill in the art by describing in detail example embodiments with reference to the attached drawings in which:

FIGS. 4A through 4C illustrate diagrams of experimental data and graphs about a lithium ion battery according to an embodiment;

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope thereof to those skilled in the art.

For example, certain shapes, structures, and characteristics described in the specification may be modified from the disclosed embodiments. Also, locations or arrangements of each component in each of the embodiments may be modified. Therefore, this is not intended to limit the embodiments to particular modes of practice, and it is to be appreciated that all changes, equivalents, and substitutes that do not depart from the spirit and technical scope are encompassed herein.

Figure 1:
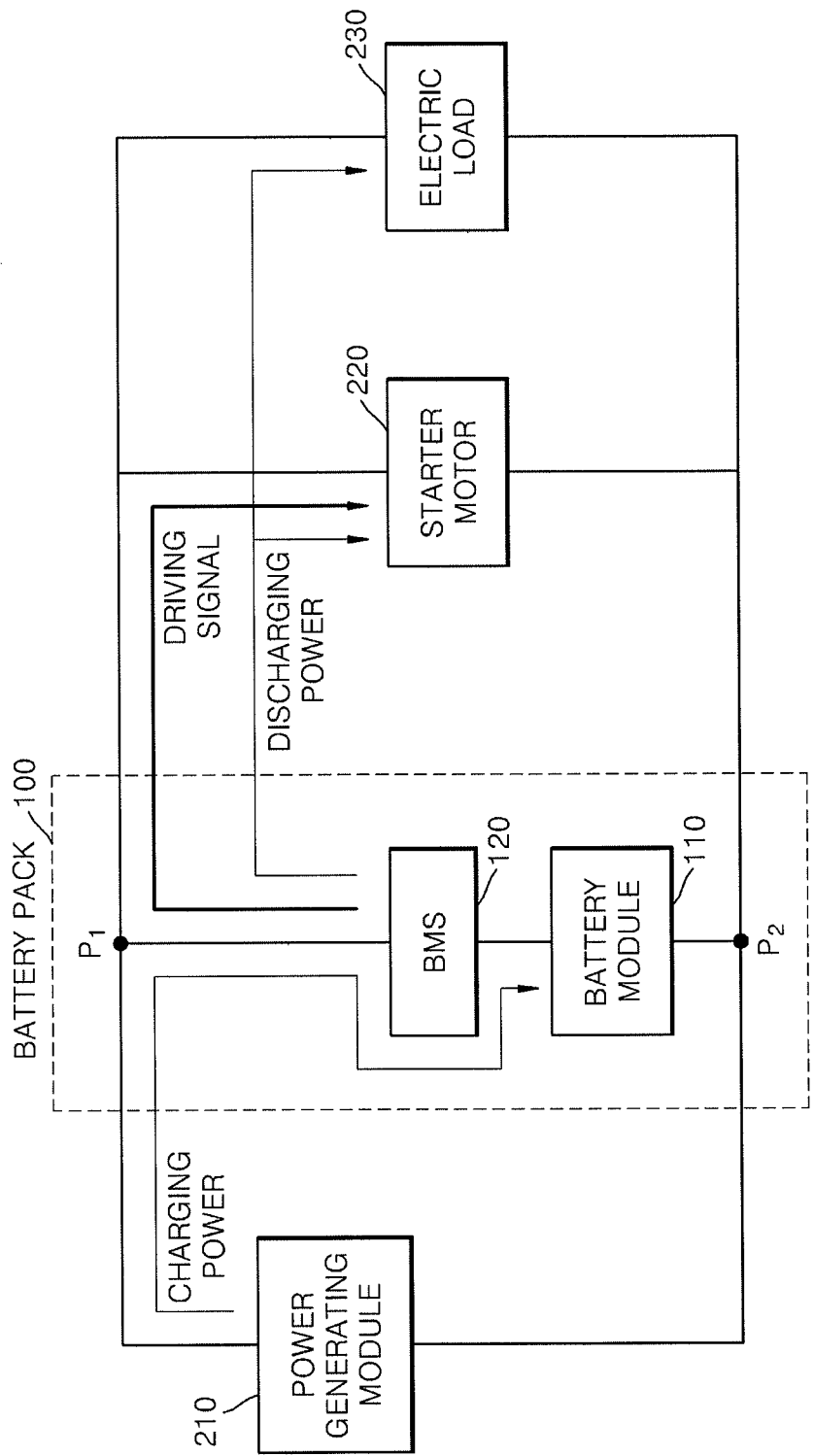
FIG. 1 illustrates a diagram showing a schematic configuration of a battery pack according to an embodiment, and a connecting status to external peripheral devices.

FIG. 1 illustrates a diagram showing a schematic configuration of a battery pack 100 according to an embodiment, and connecting status to peripheral devices.

In the example embodiment shown in FIG. 1, the battery pack 100 includes first and second terminals P1 and P2, and a battery module 110 connected between the first and second terminals P1 and P2 to receive a charging power and output a discharging power. The battery pack 100 may be electrically connected to a power generating module 210 and a starter motor 220 in parallel via the first and second terminals P1 and P2. In addition, the battery pack 100 includes a battery management system (BMS) 120 and a battery module 110 as shown in FIG. 1.

The battery pack 100 stores charging power generated by the power generating module 210, and may supply discharging power to the starter motor 220. For example, the power generating module 210 may be connected to an engine (not shown), and may be connected to a driving axis of the engine to convert a rotary driving force into an electric output. The charging power generated by the power generating module 210 may be stored in the battery module 110 via the first and second terminals P1 and P2 of the battery pack 100. For example, the power generating module 210 may include a direct current (DC) generator (not shown) or an alternating current (AC) generator (not shown), and a rectifier (not shown), and may supply a DC voltage about 15 V, for example, about 14.6 V to 14.8 V.

For example, the battery pack 100 may be used as a power device for starting an engine of an idle stop & go (ISG) system for improving fuel-efficiency. Since stop and re-start of the engine are frequently repeated in the ISG system, the charging and discharging of the battery pack 100 are repeated.

Life span of a lead storage battery that might be considered for an ISG system may be reduced due to the frequent repetition of the charging and discharging operations, and the charging and discharging characteristics degrade, for example, a charging capacity may be reduced due to the repetition of the charging and discharging operations, thereby reducing startability of the engine and reducing replacement period of the lead storage battery.

According to the present example embodiment, the battery module 110 includes a lithium ion battery maintaining constant charging and discharging characteristics and having less aging when compared with the lead storage battery, and accordingly, may be applied suitably to the ISG system in which the stop and re-start of the engine are frequently repeated. In addition, since the lithium ion battery has less weight than that of the lead storage battery having the same charging capacity, fuel-efficiency may be improved. Also, the same charging capacity may be achieved with less volume than that of the lead storage battery, and a mounting space may be saved. However, the battery module 110 of the present embodiment is not limited to the lithium ion battery, and may include, e.g., a nickel metal hydride (NiMH) battery.

The battery module 110 may include a plurality of battery cells (not shown) that are connected to each other in series and parallel with each other, and a rated charging voltage and charging capacity may be adjusted by combining the serial and parallel connection.

The battery module 110 may denote structures including a plurality of battery sub-units. For example, when the battery pack 20 is a battery rack including a plurality of battery trays, the battery rack may be referred to as a battery module 110. Likewise, when a battery tray includes a plurality of battery cells, the battery tray may be referred to as a battery module 110.

The battery module 110 of the present embodiment includes a lithium ion battery including an electrode assembly including a positive electrode plate including a positive active material, a negative electrode plate including a negative active material, and a separation film, and a case receiving the electrode assembly. The positive active material may be a combination of a plurality of positive active materials, e.g., may include a combination of at least two selected from the group of $Li_xWO_3$, $Li_xMoO_2$, $Li_xTiS_2$, $Li_xMoS_2$, $Li_xMnO_4$, $Li_xMn_2O_4$, $Li_{1-x}NiO_2$, $Li_{1-x}CoO_2$, $LiNiVO_4$, $LiF$, and $Li_xNi_yCo_zAl_{1-y-z}O_2$.

In addition, a negative electrode may be formed of a material including carbon. The negative electrode of the battery module 110 according to the present embodiment may include soft carbon and carbon black. For example, the carbon portion of negative active material of the battery module 110 may be made of up the soft carbon of about 54.5 to 99.5% and the carbon black of about 0.5 to 45.5%.

The separation film is disposed between the positive electrode plate and the negative electrode plate, and is an insulating thin film having a high ion transmittance and mechanical strength. Pores of the separation film may have a diameter of about 0.01 to 10 μm, and a thickness of the separation film may generally be about 5 to 300 μm. The separation film may be formed of, for example, olefin-based polymer having chemical resistance and hydrophobic property, a sheet or non-woven fabric formed of glass fiber or polyethylene, or craft paper. The separation film may be, e.g., a cell-guard based film, a polypropylene separation film, or polyethylene-based separation film.

In an embodiment, the battery module 110 may include the lithium ion battery including soft carbon as the negative active material. The battery module 110 including the soft carbon may have charging and discharging voltage profiles that are linear in proportional to a state of charge (SOC) of the battery module 110 according to characteristics of the material. For example, the lithium ion battery including the soft carbon at the negative electrode according to the present embodiment has linear charging and discharging voltage profiles within 70 to 90% SOC band that is mainly used by vehicles. When the charging and discharging are performed at a high speed due to the characteristics of the lithium ion battery, the battery module 110 including the soft carbon according to the present embodiment has the linear charging and discharging profiles.

Figure 2:
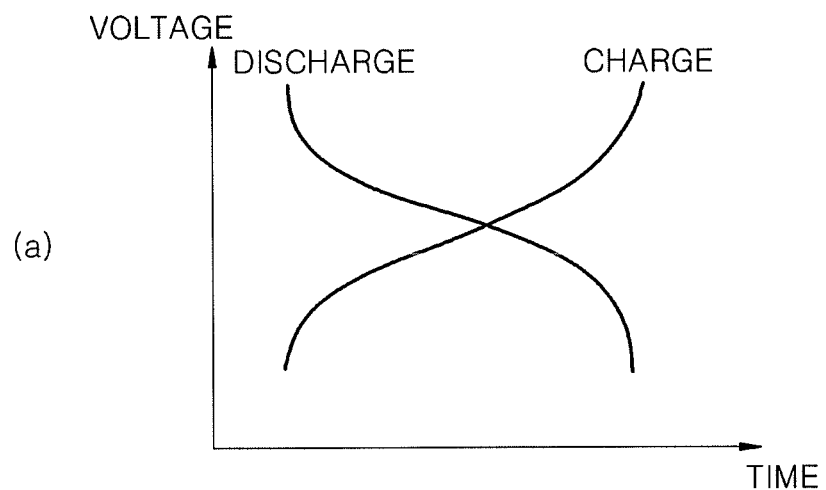
FIGS. 2A and 2B illustrate graphs of charging/discharging voltage profiles in a general lithium ion battery and charging/discharging voltage profiles of a lithium ion battery according to an embodiment.
Figure 2:
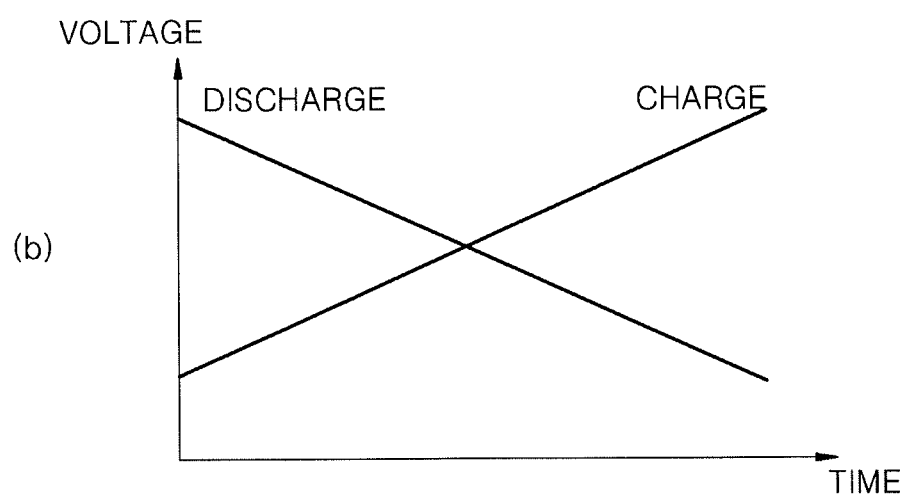

FIGS. 2A and 2B illustrate graphs of charging and discharging voltage profiles of a general lithium ion battery and charging and discharging voltage profiles of the lithium ion battery of the present embodiment.

Referring to FIG. 2A, the charging/discharging voltage profiles of the general lithium ion battery show a curvature as shown in the graph. That is, as shown in the graph, the charging/discharging voltage profiles of the general lithium ion battery have a rapid inclination at an initial stage of the charging or discharging, and may not have linearity.

On the other hand, FIG. 2B is a graph showing the charging/discharging voltage profiles of the lithium ion battery including the soft carbon as the negative active material according to the present embodiment. As shown in the graph of FIG. 2B, when the lithium ion battery includes the soft carbon as the negative active material, the charging/discharging voltage profiles are linear throughout the entire section. In particular, the lithium ion battery of the present embodiment has the linear charging/discharging voltage profiles even when the high output is maintained in a section of SOC 70 to 90% where the battery of a vehicle is mainly used.

Thus, even when the battery module 110 of a vehicle of the ISG system has the high output characteristic, according to the lithium ion battery using the soft carbon as the negative active material, the SOC may be grasped easily due to the linear charging/discharging voltages without using a complex current integrating algorithm. Therefore, since the charging/discharging graph is linear, the SOC may be identified via an open circuit voltage.

Next, the BMS 120 monitors a state of the battery and controls the charging/discharging operations. In the present embodiment, the BMS 120 calculates the SOC by using the linear charging/discharging characteristics of the lithium ion battery that uses the soft carbon as the negative active material. Functions and operations of the BMS 120 will be described in detail below.

Next, the power generating module 210 may include an alternator of a vehicle. The alternator supplies the charging power to the battery pack 100, and may supply electric power to an electric load 230 (described below) during driving the engine.

Next, the starter motor 220 is driven when starting the vehicle, and may supply an initial rotating power for rotating the driving axis of the engine. For example, the starter motor 220 receives the electric power stored in the battery pack 100 via the first and second terminals P1 and P2, and re-drives the engine by rotating the driving axis when starting the engine or re-starting the engine after idle stop. For example, the starter motor 220 provides the engine with an initial rotating power when a user starts the engine of the vehicle or in an idle go status.

Meanwhile, the electric load 230 may be connected to the battery pack 100 with the power generating module 210 and the starter motor 220. The electric load 230 consumes the electric power stored in the battery pack 100, and may receive the discharging power stored in the battery pack 100 via the first and second terminals P1 and P2 and may includes various vehicle electric devices.

The electric load 230 may include a car air-conditioner, a radio, and a remote controller receiving terminal; however, the embodiments are not limited thereto, and the electric load 230 may refer to loads that are driven when receiving an electric power from the power generating module 210 or the battery module 110. In the charging/discharging voltage profiles shown in FIGS. 2A and 2B, when the number of used electric loads 230 increases, a discharging gradient of the graph becomes greater.

Hereinafter, general functions of the BMS 120 and a method of acquiring the linear SOC characteristic of the battery module 110 according to time and relational characteristic between the SOC and charging/discharging voltage profiles by the BMS 120 and, providing the SOC of the battery module 110 according to the acquired characteristics without a complex calculation operation will be described.

The BMS 120 of the present embodiment is connected to the battery module 110, and controls the charging and discharging operations of the battery module 10. In addition, the BMS 120 may perform functions such as an over-charging protection, an over-discharging protection, an over-current protection, an over-voltage protection, an over-heat protection, and a cell-balancing function. To do this, the BMS 120 may include a measuring unit for measuring the voltage, the current, the temperature, the remaining electric power, the life span, and the SOC from the battery module 110, and may control external devices, e.g., the starter motor 220 and the power generating module 210, by generating control signals based on the measurement results.

An SOC determination method may use a method such as a voltage measuring method, a current integrating method, and a current integrating and a Kalman filter application method in order to determine the SOC. In the present embodiment, the BMS 120 may predict the SOC of the battery module 110 without using the above described SOC determination method that is complex, using the linear charging/discharging voltage profiles of the lithium ion battery using the soft carbon as the negative active material. An example will be described with reference to FIG. 3.

Figure 3:
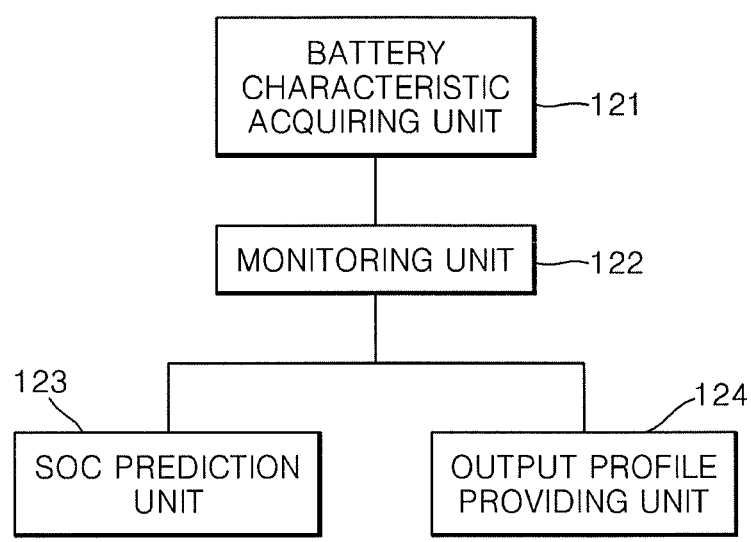
FIG. 3 illustrates a block diagram showing an internal structure of a battery management system (BMS) according to an embodiment for acquiring a state of charge (SOC)

FIG. 3 illustrates a block diagram of the BMS 120 for acquiring the SOC according to the present embodiment.

In the example embodiment shown in FIG. 3, the BMS 120 includes a battery characteristic acquiring unit 121, a monitoring unit 122, an SOC prediction unit 123, and an output profile providing unit 124.

First, the battery characteristic acquiring unit 121 acquires linear charging and discharging characteristics of the battery module 110. As described above, the lithium ion secondary battery including the soft carbon as the negative active material has the linear charging/discharging voltage profiles according to the present embodiment. By using the above characteristic, the battery characteristic acquiring unit 121 may obtain the linear charging and discharging characteristics so that SOC prediction unit 123 predicts the SOC of the battery module 110. The battery characteristic acquiring unit 121 may refer to data showing the battery characteristics input in advance, or may refer to data recording the SOC according to time by repeatedly performing the charging/discharging operations directly.

Figure 4B:
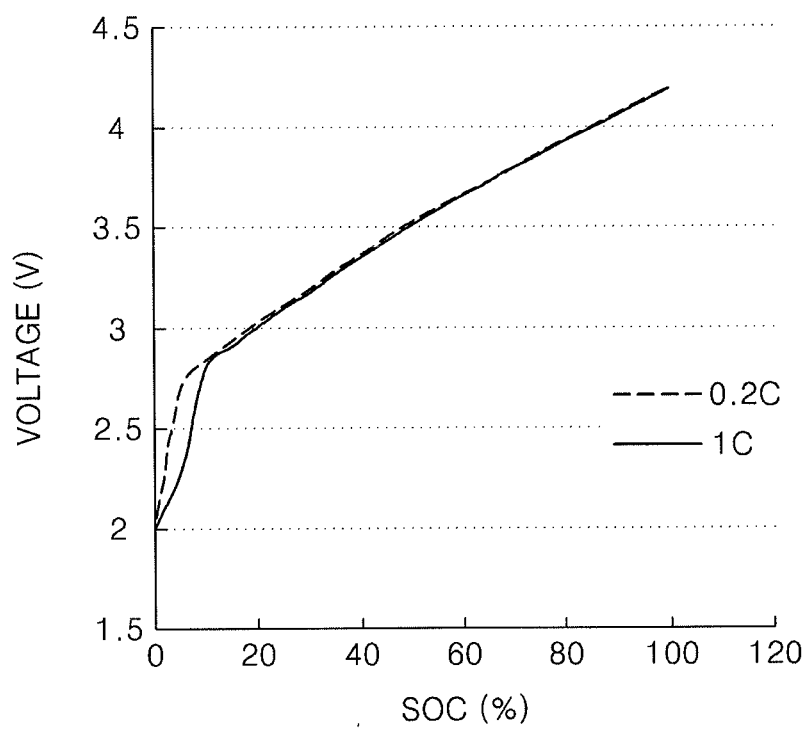
Figure 4C:
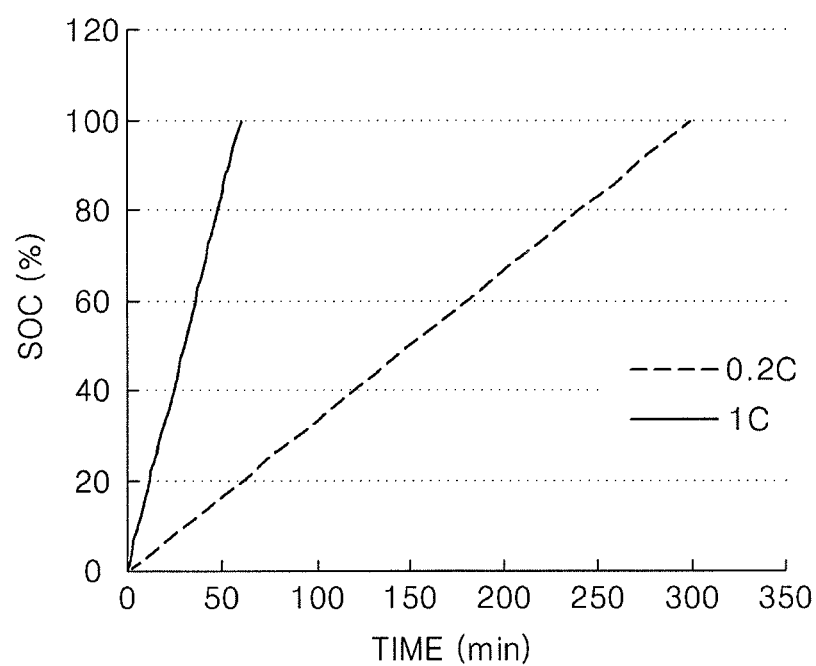

FIGS. 4A through 4C illustrate diagrams showing experimental data and graphs about the lithium ion battery according to the present embodiment.

Referring to FIGS. 4A through 4C, FIG. 4A shows data representing the SOC and voltage values of the lithium ion battery having the linear charging/discharging voltage profiles according to time, FIG. 4B is a graph showing the data of FIG. 4A with respect to the SOC and the voltage, and FIG. 4C is a graph showing the data of FIG. 4A with respect to the time and the SOC.

FIG. 4A shows data representing the SOC and the voltages of the battery module 110 after charging the battery module 110 including the soft carbon as the negative active material at 0.2 C and 1 C per second. As a reference, #1 and #2 show the number of experiments, and the graph shows an average of the experiments #1 and #2. Referring to the graph of FIG. 4B, the voltage profiles of the battery module 110 have linearity except for a partial section. In particular, the graph shows linearity within a section between 70% and 90% that is the SOC band mainly used by the vehicle.

The lithium ion battery including the soft carbon as the negative active material according to the present embodiment has the linear charging/discharging voltage profiles as shown in FIG. 4B, and the battery characteristic acquiring unit 121 may acquire the SOC of the entire voltage section by using a relation between the SOC-voltage in a partial section. By using the above feature, the SOC with respect to the voltage value within the entire section may be acquired based on the voltage value of a partial section.

Also, referring to the graph of 4C, the battery module 110 has the linear SOC characteristic that is proportion to time. By using the above feature, the SOC characteristic in proportion of time can be predicted by using SOC-time in partial section.

Although the charging voltage graph is only shown in FIGS. 4B and 4C, the battery characteristic acquiring unit 121 acquires the discharging voltage characteristics of the battery module 110. The discharging voltage characteristics are determined according to engine efficiency and characteristics of the electric loads in the vehicle in which the battery module 110 is mounted. In a vehicle of the ISG system, the start and re-start of the engine happen frequently, and thus, an output profile may be obtained by using the linear SOC characteristic according to the present embodiment.

In particular, the lithium ion battery of the present embodiment has linearity in the SOC band of 70 to 90% that is mainly used by the vehicle, and thus, the battery characteristic acquiring unit 121 acquires the voltages of the SOC section between 70% and 90%.

Since a power generator, e.g., an alternator, is connected to the battery module 110 used in a vehicle to continuously charge the battery module 110, the SOC of the battery module 110 is generally maintained at 70% or greater. In addition, since the battery module 110 is continuously discharged due to the starter motor 220 and the electric loads 230 in the vehicle, the SOC of the battery module 110 is generally maintained at 90% or less. However, the above description is about the SOC section where the battery module 110 of the vehicle is mainly used, and the embodiments are not limited to the above range.

Next, the monitoring unit 122 monitors a state of the battery module 110 having the linear charging/discharging voltage profiles. To do this, the monitoring unit 122 continuously checks an output voltage and an output current used by the battery module 110. In addition, the monitoring unit 122 checks elapsed time during the charging or the discharging operation so that the SOC prediction unit 123 and the output profile providing unit 124 may acquire prediction values based on the data of the battery characteristic acquiring unit 121.

Next, the SOC prediction unit 123 predicts the current SOC of the battery module 110 based on the data of the battery characteristic acquiring unit 121. As described above, although the lithium ion battery has the high output property, it is difficult to obtain the SOC through the current integrating algorithm every time due to the frequent outputs of the vehicle of the ISG system. Therefore, the SOC prediction unit 123 may predict the SOC by using the linear charging/discharging characteristics of the battery module 110.

For example, since the lithium ion battery including the soft carbon according to the present embodiment maintains linearity of voltage profile within the 70 to 90% of the SOC band that is mainly used by the vehicle, the SOC may be obtained only by using the time information based on the charging/discharging voltage profiles in this mainly-used section.

As described above, the lithium ion battery including the soft carbon according to the present embodiment has the linear SOC characteristic that is in proportion to the voltage profiles and in proportion to the time even under the high output condition in the vehicle of the ISG system. Therefore, the SOC prediction unit 123 may predict SOC by voltage profile information or time information.

In addition, the SOC prediction unit 123 of the present embodiment may acquire the SOC based on the charging/discharging voltage profiles provided from the output profile providing unit 124 that will be described later. Since the lithium ion battery of the present embodiment also has the linear charging/discharging voltage profiles in proportion to time, the SOC prediction unit 123 may predict the SOC corresponding to the charging/discharging voltage values that is predicted only by the time information.

The output profile providing unit 124 provides the SOC prediction unit 123 with the output profile by using the charging/discharging voltage profile characteristic having linearity according to time. Since the lithium ion battery of the present embodiment has the linear charging/discharging voltage profiles, the charging/discharging output profiles according to time may be provided based on the data of the battery characteristic acquiring unit 121 without monitoring the voltage in real-time by the monitoring unit 122. For example, since the battery module 110 of the present embodiment has the linear charging/discharging voltage characteristic with respect to time, a voltage value after a predetermined time has passed since the engine stops may be predicted only by using time information. Also, the output profile providing unit 124 may rapidly provide the output profile when starting the engine, by using linearity even when the battery module 110 operates under the high output condition. The output profile acquired by the output profile providing unit 124 is used for the SOC prediction unit 123 to predict the SOC based on the charging/discharging voltages.

Figure 5:
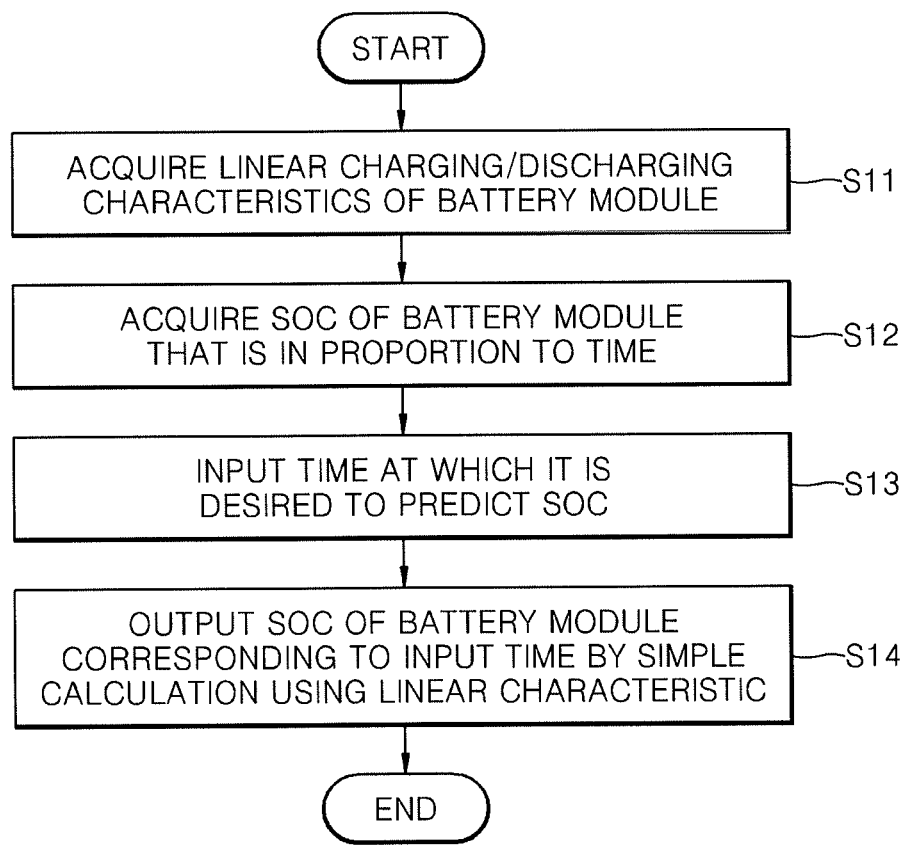
FIG. 5 illustrates a flow chart illustrating processes of acquiring the SOC by the BMS according to an embodiment.

FIG. 5 illustrates a flowchart of processes of the SOC by the BMS 120 according to an embodiment.

Referring to FIG. 5, the BMS 120 acquires the linear charging/discharging characteristics of the battery module 110 (S11). The battery module 110 of the present embodiment includes the lithium ion batteries including the soft carbon as the negative active material, and the battery module 110 has the linear charging/discharging characteristics. In other embodiments, other types of batteries having linear charging/discharging characteristics could be used.

Next, the SOC characteristic of the battery module 110 that is in proportional to the time is acquired (S12).

Next, input of the time when the SOC is wanted to be obtained is received (S13). In other words, the time at which it is desired to predict a new SOC is received.

Then, the SOC of the battery module 110 corresponding to the input time is output by a simple calculation using the linear characteristic (S14). Hence, according to the flowchart of FIG. 5 the BMS 120 can predict a new SOC using a simple calculation method.

Figure 6:
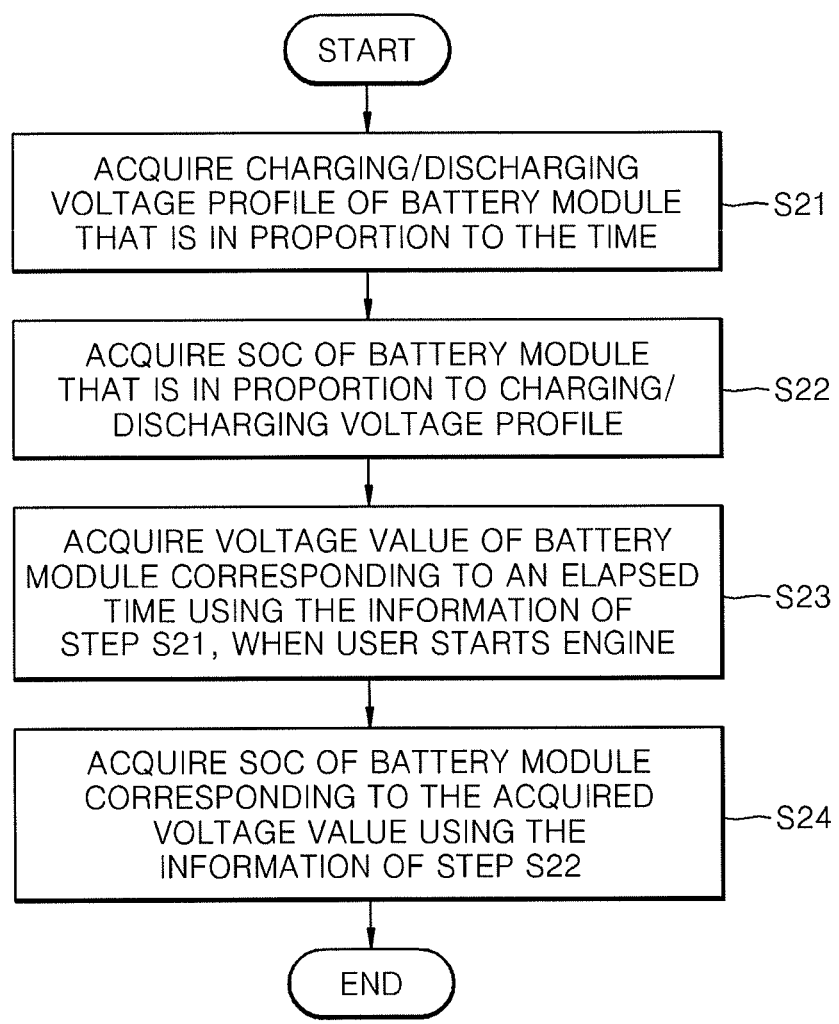
FIG. 6 illustrates a flowchart of processes of acquiring the SOC by using output profiles when the BMS starts an engine according to an embodiment.

FIG. 6 illustrates a flowchart of processes of obtaining the SOC by the BMS 120 when starting the engine.

Referring to FIG. 6, the charging/discharging voltage profile of the battery module 110, which is in proportion to the time, is acquired (S21).

Then, the SOC of the battery module 110 in proportion to the charging/discharging voltage profile is acquired (S22). In other words the profile of SOC against voltage is obtained.

Next, a voltage value of the battery module 110 corresponding to time elapsed is acquired by using information of operation S21, when the user starts engine (S23).

Next, the SOC corresponding to the voltage value of the battery module 110 is acquired by using information of operation S22 (S24).

By way of summation and review, a lead storage battery may be considered as a power supply device for starting an engine. An idle stop and go (ISG) may be used to improve fuel-efficiency. A power supply device supporting the ISG system that is a system for restricting idle driving should maintain a strong high output property for starting an engine, recharge and discharge properties regardless of frequent engine stop/start, and long life span. However, for the general lead storage battery, the rechargeable and dischargeable properties may be degraded and the battery may not be useable for long due to frequent engine stop and restart operations under the ISG system. Therefore, usage of lithium ion secondary batteries in the ISG system may be desirable, and the lithium ion secondary battery may be capable of generating high output.

EXPLANATION OF REFERENCE NUMERAL

100: battery pack
110: battery module
120: BMS
121: battery characteristic acquiring unit
122: monitoring unit
123: SOC prediction unit
124: output profile providing unit
210: power generating module
220: starter motor
230: electric load Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A battery pack, comprising:
a rechargeable battery module; and
a battery management system for controlling charging and/or discharging of the battery module, wherein:
the battery module includes a substantially linear charging and discharging voltage-time profile within at least part of the charging and discharging cycle of the battery module, and the battery management system is configured to calculate a state of charge of the battery module by using linear charging and/or discharging characteristics of the battery module; and
wherein the battery management system is arranged to calculate a second state of charge of the battery module after a time period of charging or discharging by determining a first state of charge of the battery module and then using the linear charging and/or discharging characteristics of the battery module.

2. The battery pack according to claim 1, wherein:
the first state of charge is a current state of charge of the battery module and the second state of charge is a predicted state of charge of the battery module, or the first state of charge is a previous state of charge of the battery module and the second state of charge is a current state of charge of the battery module.

3. The battery pack according to claim 1, wherein the battery management system is configured to determine the first state of charge of the battery module by measuring an output voltage of the battery module.

4. The battery pack according to claim 1, wherein the battery management system is configured to determine the substantially linear charging and discharging voltage-time profile.

5. The battery pack according to claim 4, wherein the battery management system is arranged to determine a charging and discharging voltage-time profile over a sub-range of state of charges, and then use this to determine the substantially linear voltage-time profile for a wider range of state of charges.

6. The battery pack according to claim 4, wherein the battery management system is arranged to use the determined substantially linear charging and discharging voltage-time profile to determine a substantially linear charging and discharging voltage-state of charge profile.

7. The battery pack according to claim 1, wherein a charging and discharging voltage-state of charge profile of the battery module is linear within a range of states of charge from 70% to 90% state of charge.

8. The battery pack according to claim 1, wherein the battery module consists of one or more lithium ion batteries.

9. The battery pack according to claim 8, wherein the one or more lithium ion batteries each include a negative active material, the negative active material including carbon black and soft carbon.

10. The battery pack according to claim 9, wherein the negative active material includes a total weight amount of the carbon black and the soft carbon that is made up of about 54.5 to 99.5% of the soft carbon and about 0.5 to 45.5% of the carbon black.

11. The battery pack according to claim 9, wherein the negative active material includes about 54.5 to 99.5% of the soft carbon and about 0.5 to 45.5% of the carbon black.

12. A power apparatus for an idle stop and go system for starting an engine, comprising:
the battery pack according to claim 1;
a power generating module for charging the battery module; and
a starter motor arranged to be powered by discharge of the battery module.

13. The power apparatus according to claim 12 when dependent on claim 6, wherein on starting the engine, the battery management system is arranged to determine an engine start voltage value of the battery module based on an elapsed time using the determined substantially linear charging and discharging voltage-time profile, and then using the engine start voltage value and the determined substantially linear charging and discharging voltage-state of charge profile to determine an engine start state of charge value.

* * * * *